United States Patent [19]

Wang

[11] Patent Number: 5,548,543

[45] Date of Patent: Aug. 20, 1996

[54] COMPUTATIONALLY EFFICIENT LINEAR-PHASE FINITE IMPULSE RESPONSE FILTER

[75] Inventor: Avery Li-Chun Wang, Redwood City, Calif.

[73] Assignee: Stanford University, Stanford, Calif.

[21] Appl. No.: 352,382

[22] Filed: Dec. 8, 1994

[51] Int. Cl.$^6$ .................................................. G06F 17/10
[52] U.S. Cl. .............................. 364/724.16; 364/724.17
[58] Field of Search ........................... 364/724.16, 724.17

[56] References Cited

U.S. PATENT DOCUMENTS

| | | | |
|---|---|---|---|
| 5,089,981 | 2/1992 | Cabot | 364/724.17 |
| 5,269,313 | 12/1993 | DePinto | 364/724.17 |
| 5,337,264 | 8/1994 | Levien | 364/724.17 |
| 5,373,460 | 12/1994 | Marks, II | 364/724.17 |
| 5,388,063 | 2/1995 | Takatori et al. | 364/724.17 |
| 5,402,795 | 4/1995 | Reichl | 364/724.17 |

OTHER PUBLICATIONS

Kay, "Statistically/Computationally Efficient Frequency Estimation" *Proc. ICASSP*, pp. 2292–2295, 1988, IEEE Service Center.

Saramäki et al "Properties & Structures of Linear–Phase FIR Filters Based on Switching & Resetting of IIR Filters" *Proc. IEEE Int. Symposium on Circuits & System*, 1990, pp. 3271–3274.

*Primary Examiner*—David H. Malzahn
*Attorney, Agent, or Firm*—Lumen Intellectual Property Services

[57] ABSTRACT

A discrete-time filter processes digital signals according to a specified function. It has a linear-phase response if all frequencies experience the same time delay when passing through the filter. In this invention computationally efficient digital filters with linear-phase response are constructed according to a very general and computationally efficient algorithm. The invention also specifies a method for constructing fast truncated infinite impulse response filters with polynomial-times-exponential response. The method may be used to design efficient special purpose filters for numerous dedicated applications, or it may be encoded on a chip to permit the creation in real time of many specific filters according to variable filtering parameters. Applications include fast high-resolution frequency estimation (e.g., for pitch tracking and radar) and fast digital filtering in commercial digital audio systems (e.g., for real-time mixing and equalization of signals and digital loudspeaker crossover networks).

12 Claims, 10 Drawing Sheets

STABLE TIIR FILTER RESPONSE -- STABILIZED (LINEAR SCALE)

STABLE TIIR FILTER RESPONSE -- STABILIZED (LOG SCALE)

UNSTABLE TIIR FILTER RESPONSE -- NOT STABILIZED (LINEAR SCALE)

UNSTABLE TIIR FILTER RESPONSE -- NOT STABILIZED (LOG SCALE)

UNSTABLE TIIR FILTER RESPONSE -- STABILIZED (LINEAR SCALE)

UNSTABLE TIIR FILTER RESPONSE -- STABILIZED (LOG SCALE)

STABLE TIIR FILTER RESPONSE -- STABILIZED (LINEAR SCALE)

STABLE TIIR FILTER RESPONSE -- STABILIZED (LOG SCALE)

FAST LINEAR PHASE FILTER RESPONSE (LINEAR SCALE)

FAST LINEAR PHASE FILTER RESPONSE (LOG SCALE)

5,548,543

COMPUTATIONALLY EFFICIENT LINEAR-PHASE FINITE IMPULSE RESPONSE FILTER

FIELD OF THE INVENTION

This invention relates to digital filter design, and in particular to the design and operation of discrete-time linear-phase filters with finite impulse responses.

BACKGROUND AND PRIOR ART

Digital filtering of discrete-time sampled signals is used extensively in commercial applications such as compact disc players, digital stereo systems, digital mixing boards, digital speaker crossover networks, and in many other audio and non-audio signal processing applications. In order to make digital filters practical for real-time applications, they must have sufficiently low computational complexity. Additionally, many applications require a linear-phase response in order to avoid frequency dependent temporal distortions.

Present technology employs two major types of digital signal filters: infinite impulse response (IIR) filters and finite impulse response (FIR) filters (see Oppenheim & Schafer, *Discrete-Time Signal Processing*, Prentice Hall, 1989, which is incorporated herein by reference). IIR filters are fast, due to their computational simplicity, but introduce temporal distortions into signals because they do not have linear-phase response. FIR filters, on the other hand, can be designed to have linear-phase response and hence no temporal distortion, but are generally slow due to the large number of arithmetic operations performed per sample of input. Clearly, it would be desirable to design a filter that combines the computational efficiency of an IIR filter with the linear-phase response of an FIR filter.

Oppenheim & Schafer, *Digital Signal Processing*, Prentice Hall, 1975, p. 161, describe an FIR filter which has the computational efficiency of an IIR filter. To avoid the stability difficulties inherent in their approach, however, they introduce a scaling factor which destroys the linear-phase response of the filter. Moreover, their approach does not allow for the implementation of filters with repeated poles.

One possibility for obtaining such a combination is to improve the computational efficiency of an FIR filter by taking advantage of the computationally efficient features of IIR filters while also retaining the desirable linear-phase properties. This combination of features may be accomplished by truncating the response of an IIR filter to obtain a truncated infinite impulse response (TIIR) filter.

This approach was used by Fam and Saramäki, *Proc. IEEE Int. Symposium on Circuits and Systems,* 1990, p. 3271, to obtain a limited class of linear-phase response FIR filters having the efficiency of IIR filters. Their method, however, has several disadvantages. The class of filters that is constructable by their methods is restricted to filters with pure exponential impulse responses. In particular, their method can not be used to construct truncated polynomial-times-exponential response filters, which have several important applications, including high-resolution frequency estimation. Moreover, their method of constructing and implementing filters is complicated and, consequently, is not amenable to generating or adjusting filter parameters in real-time applications. Nor do they suggest ways to make efficient FIR filters time-varying.

SUMMARY OF THE INVENTION

Accordingly, a primary object of this invention is to provide a method for constructing and implementing polynomial-times-exponential response TIIR filters and fast linear-phase response FIR filters. An additional object of the invention is to provide such a method which has sufficient algebraic simplicity to permit real-time filter generation and adjustment. Accordingly, it is also an object of the invention to provide a method for so adjusting filters in real time.

The disclosed method is based on the Applicant's Ph.D. dissertation entitled "Instantaneous and Frequency-Warped Signal Processing Techniques for Auditory Source Separation," Report No. STAN-M-86, Department of Music, Stanford University, Stanford, Calif. 94305, which is hereby incorporated by reference. The method improves upon the approach of Fam and Saramäki by employing a general algorithm for producing a wide class of filters. In contrast to the approach of Fam and Saramäki, this method is more computationally efficient and allows for the construction of filters with polynomial-times-exponential as well as exponential impulse responses. Because it can implement polynomial-times-exponential response filters, it may be applied to the frequency estimation algorithm of S. Kay ("Statistically/computationally efficient frequency estimation", in *Proc. ICASSP,* pp. 2292–2295, IEEE Service center, 1988) to provide fast and accurate frequency estimation for such uses as audio pitch tracking and radar.

The improved computational efficiency of the disclosed method over that of prior linear-phase filtering methods allows the same linear-phase filter to be realized using only a fraction of the computational power previously needed. Alternatively, several linear-phase filters may be implemented using the same computational resources as one equivalent linear-phase filter using prior methods. Consequently, certain previously impractical or expensive signal processing applications become feasible with affordable equipment. An example of such an application is linear-phase equalization for digital audio purposes. Further objects and advantages of this invention will become apparent from a consideration of the drawings and ensuing description.

BRIEF DESCRIPTION OF DRAWING FIGURES

DETAILED DESCRIPTION—STABLE TIIR FILTER OPERATION

We first illustrate the method of the invention for the operation and construction of a stable TIIR filter.

Figure 1:
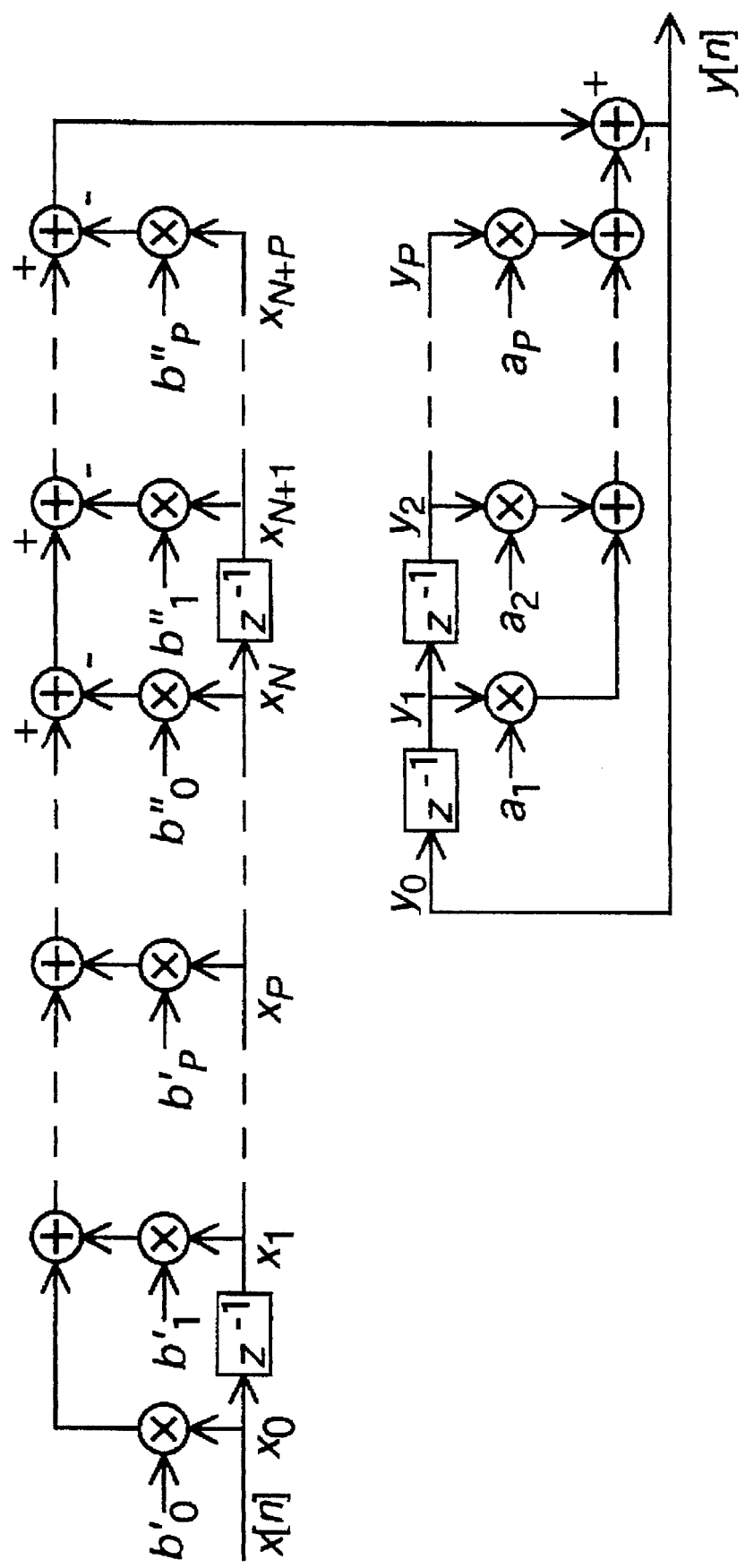
FIG. 1 is a schematic diagram showing the operation of a TIIR filter according to the invention.

FIG. 1 is a schematic diagram showing how a filter generates an output signal from an input signal. The input signal is represented by an input signal sequence, $x[0], x[1], x[2], \ldots, x[n]$, where $x[0]$ is the initial input signal amplitude and $x[n]$ is the present input signal amplitude. In what follows, we assume that the present input signal occurs n sampling periods after signal initiation. A typical sampling period, such as may be used in commercial CD players, is 22.6 μs (44.1 kHz). Similarly, the filter output signal is represented by an output signal sequence, $y[0], y[1], y[2], \ldots, y[n]$.

A filter contains an input delay line consisting of a sequence $x_0, x_1, \ldots, x_{N+P}$ of $N+P+1$ values stored in a computer memory, where $x_i$ is the value of the input signal i sampling periods ago, i.e. $x_i=x[n-i]$. In particular, $x_0$ is the value of the present input signal, i.e. $x_0=x[n]$. It is often convenient to write this sequence as a vector, $x=(x_0, x_1, \ldots, x_{N+P})$.

The filter also contains an output delay line stored in computer memory, represented by the vector $y=(y_1, y_2, \ldots, y_P)$ whose components consist of P values, where $y_i$ is the output signal of the filter i sampling periods ago. Note that the present output value, $y_0=y[n]$, is not contained in this vector.

The present output value, $y_0$, is generated from x and y according to predetermined filter response characteristics. These filter response characteristics determine three filter response vectors, $b'=(b'_0, \ldots, b'_P)$, $b''=(b''_0, \ldots, b''_P)$, and $a=(a_1, \ldots, a_P)$, which may be stored in computer memory. The output signal is calculated from the input signal by means of an output relation $y_0=b' \cdot x' - b'' \cdot x'' - a \cdot y$, which is represented schematically in FIG. 1. The vectors $x'=(x_0, \ldots, x_P)$ and $x''=(x_N, \ldots, x_{N+P})$ are the initial $P+1$ and final $P+1$ values of the input delay line $x=(x_0, x_1, \ldots, x_{N+P})$, and $$a \cdot y = \sum_{i=1}^{P} a_i y_i, \quad b' \cdot x' = \sum_{i=0}^{P} b'_i x_i, \text{ and } b'' \cdot x'' = \sum_{i=0}^{P} b''_i x_{N+i}$$

are the standard dot product of vectors.

The operation of the filter is specified by the following set of filter operation instructions. These instructions may be executed by a microprocessor each sampling period, or performed by a customized integrated circuit. Initially, the input and output delay lines x and y are cleared.

1. Shift the input delay line: Let $x_i=x_{i-1}$ for $i=N+P, \ldots, 1$.
2. Store the new signal input value in the input delay line: Let $x_0=x[n]$.
3. Shift the output delay line values: Let $y_i=y_{i-1}$ for $i=P, \ldots, 1$.
4. Calculate the new signal output value: Let $y[n]=b' \cdot x' - b'' \cdot x'' - a \cdot y$.
5. Store the new signal output value in the output delay line: Let $y_0=y[n]$.

Note that in actual computer implementation, the shifting of x and y in steps 1 and 3 may be simulated efficiently by using modular ring buffers and pointer arithmetic.

Figure 2A:
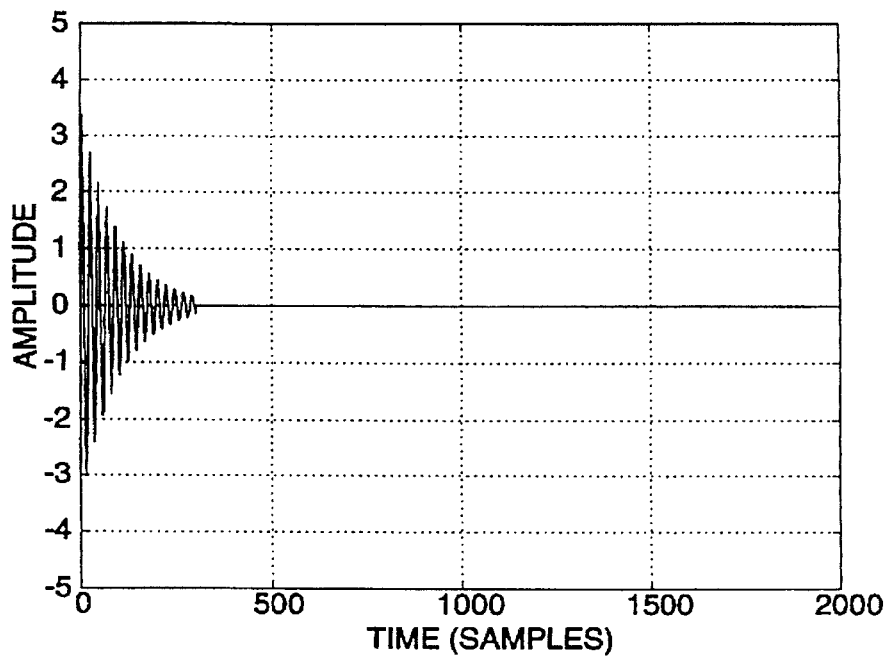
FIG. 2 shows graphs of the output of a stable TIIR filter, according to the invention.
Figure 2B:
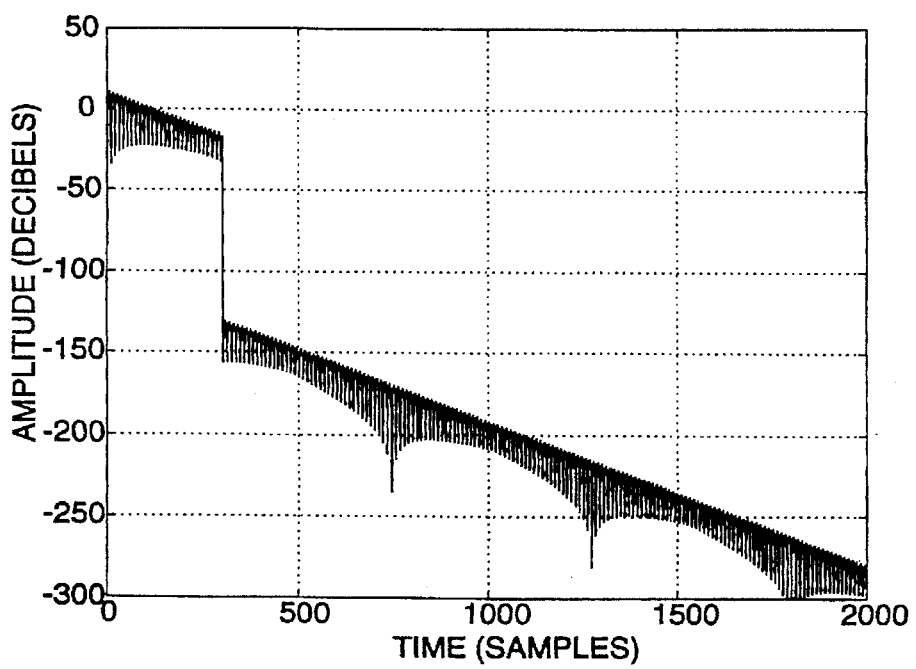

FIG. 2 shows two graphs of the output generated by a stable TIIR filter according to the above method. Since this filter is assumed to be stable, there is no need for stabilization.

DETAILED DESCRIPTION—STABLE TIIR FILTER CONSTRUCTION

Figure 3A:
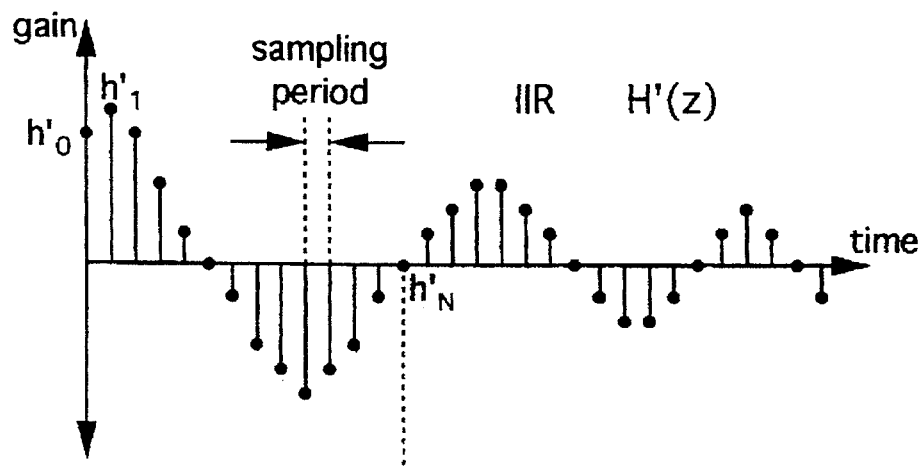
FIG. 3 shows graphs an IIR filter's impulse response, its tail response, and its truncated response, according to the invention.
Figure 3B:
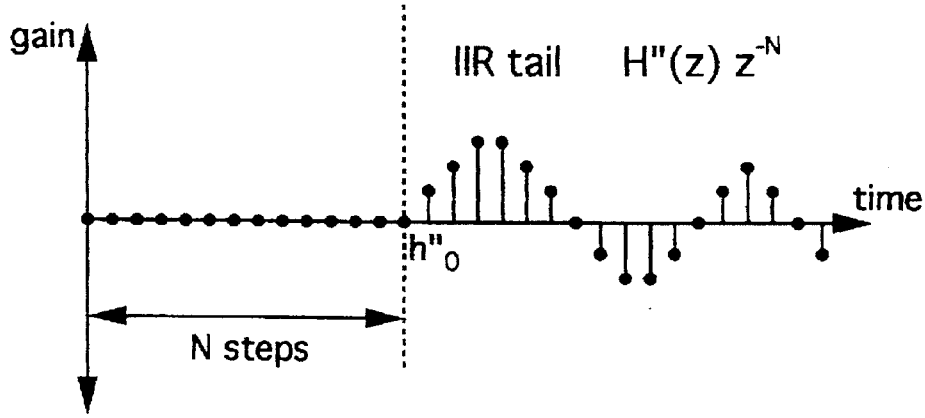
Figure 3C:
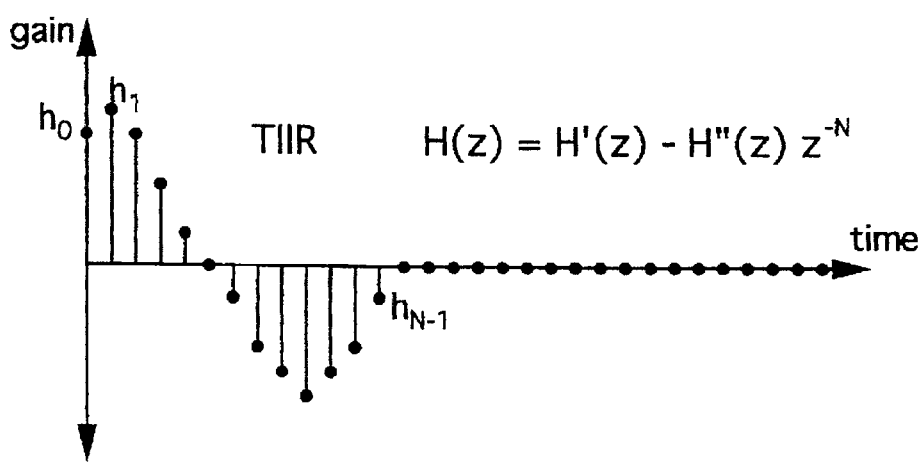

Having thus specified the operation of the stable TIIR filter, we now specify the method for constructing it, i.e., the method for deriving the above output relation and for determining the filter response sequences a, b', and b" from given filter characteristics. FIG. 3 is a pictorial representation of this method.

The filtering characteristics of an IIR filter with a desired magnitude frequency response are specified by a rational transfer function, $$H'(z) = \frac{B'(z)}{A(z)} = h'_0 + h'_1 z^{-1} + \ldots + h'_N z^{-N} + \ldots,$$

where $B'(z)=b'_0+b'_1 z^{-1}+ \ldots +b'_P z^{-P}$ and $A(z)=1+a_1 z^{-1}+ \ldots +a_P z^{-P}$. The constants $h'_0, h'_1, \ldots$ are the filter impulse response coefficients graphed in FIG. 3. The design procedure for determining the coefficients for rational IIR filters with desired magnitude response characteristics is well-known to those skilled in the art and is described in Oppenheim and Schafer.

We now disclose the general method for constructing a filter transfer function $H(z)$ with filter impulse response coefficients $h_i=h'_i$ for $i=0, \ldots, N$ and $h_i=0$ for $i>N$, i.e. we show how to truncate from $H'(z)$ the infinite tail, $h'_{N+1} z^{-N-1} + h'_{N+2} z^{-N-2} + \ldots$, to obtain the finite impulse response, $H(z)=h'_0+h'_1 z^{-1}+ \ldots h'_N z^{-N}$.

The filter $H(z)$ may be efficiently generated as follows. Multiplying both sides of $$H'(z) = \frac{B'(z)}{A(z)}$$

by $z^N$ gives $$H'(z)z^N = \frac{B'(z)z^N}{A(z)}.$$

Using the synthetic division algorithm to perform the division indicated on the right hand side, this equation may be written as $$H'(z)z^N = C(z) + \frac{B''(z)}{A(z)},$$

where $C(z)=h'_0 z^N + \ldots + h'_{N-1} z^1 + h'_N$ is the polynomial result of the division and $B''(z)=b''_0+b''_1 z^{-1}+ \ldots +b''_P z^{-P}$ is the remainder. The synthetic division algorithm guarantees that polynomials $C(z)$ and $B''(z)$ exist, are unique, and that $b''_0=0$ (Dean, *Classical Abstract Algebra*, Harper & Row, 1990, p. 225). Now dividing by $z^N$, the equation for the original transfer function may be written $$H'(z) = \frac{B'(z)}{A(z)} = C(z)z^{-N} + \frac{B''(z)z^{-N}}{A(z)},$$

where the first term of the sum is the desired finite impulse response and the second term is the tail. Thus the desired finite impulse response is given by $$H(z) = C(z)z^{-N} = \frac{B'(z) - B''(z)z^{-N}}{A(z)}.$$

This transfer function then gives rise to the corresponding filter output relation $y_0 = b' \cdot x' - b'' \cdot x'' - a \cdot y$.

In a preferred embodiment, a microprocessor is given a, b', N, and a set of filter construction instructions which calculate b" as described above. Since the synthetic division algorithm is both general and efficient, a wider class of TIIR filters may be implemented using this method and filter responses may be changed in real time. In an alternative embodiment, a, b', and b" are determined by the filter design engineer and preset in the filter during the manufacturing stage.

In summary, to determine this TIIR filter output relation, it suffices to find b" from b' and a by using the synthetic division algorithm to find B"(z) from B'(z) and A(z). The synthetic division algorithm can be implemented easily by anyone skilled in the art. For example, the following computer instructions written in C will perform the synthetic division algorithm.

```
#import <math.h>
#import <stdio.h>
#import <stdlib.h>
void make_tail_canceller(
    int P,          // This is the order of the IIR dynamics
    double *a,      // coeff of A(z)=z^P+a__1 z^(P-1)+ ... +a_P
                    // A(z) is monic. This array has P+1 elts.
                    // a[0]=1, a[1]=a1, ... a[P]=a_P,
                    // the value of a[0] is ignored.
    double *b,      // coeff of B'(z)
                    // =b_0 z^P+b_1 z^(P-1)+ ... +b_P
                    // There are P+1 elements in this array.
    double *bb,     // coeff of B"(z), has P+1 elts.
                    // The results of this routine are returned
                    // here. B'(z) has degree P-1 and thus has P
                    // coefficients. The reason space is
                    // allocated for P+1 coefficients is that
                    // sometimes we have to account for the
                    // reversed h_0 component.
    int N           // The number of samples to propagate the
                    // impulse response in order to form B"(z).
)
/*
    This routine performs the synthetic division algorithm
    on z^N B'(z) by A(z). The remainder is the unique
    polynomial B'(z) of degree P-1 such that z^N B'(z)–B"(z)
    is divisible by A(z), i.e. z^N B'(z) is congruent to
    B"(z) mod A(z). We assume that all coefficients are
    real.
*/
{
    int i,j;
    real *w; // working space. Holds running remainder.
    real factor;
    w=(real *)malloc((P+1)*sizeof(real));
    /*** load the numerator ***/
    for(i=0;i<P+1;i++){
        w[i]=b[i];
    }
    /*** do synthetic division ***/
    for(i =0; i<=N;i++){
        factor=w[0];
        for(j=1;j<=P;j++){
            w[j-1]=w[j]-factor*a[j];
        }
        w[P]=0;
        /*** The remainder after the i-th step is in ***/
        /*** w[0 .. (P-1)] ***/
    }
    /*** copy the result to the output array ***/
    for(i=0;i<P;i++){
        bb[i+1]=w[i];
    }
    bb[0]=0;
    /*** Note bb[0]==0. This is used to take into account
    the fact that we may wish to add an extra term to
    make a time-reversed filter.
    ***/
    free(w);
}
```

DETAILED DESCRIPTION—UNSTABLE TIIR FILTER

Figure 4A:
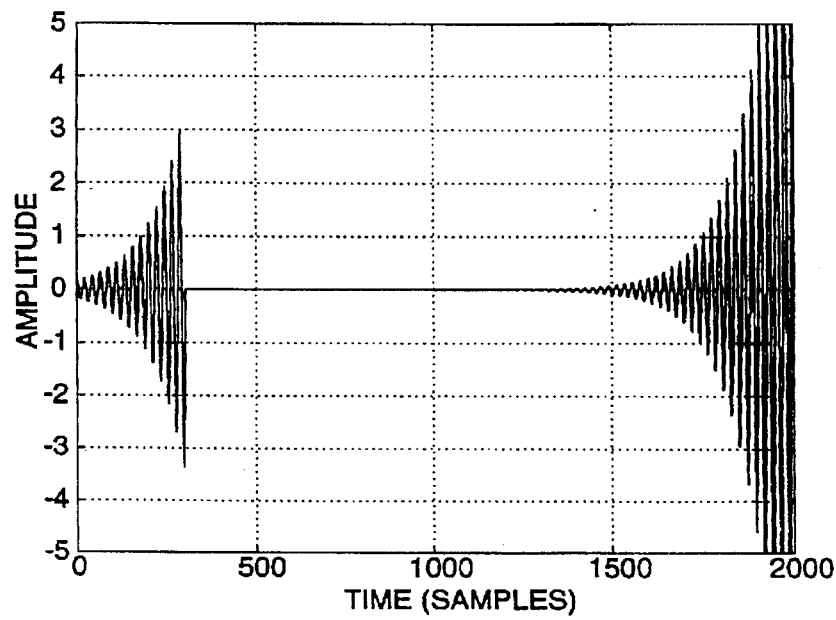
FIG. 4 shows graphs of the output of an unstable TIIR filter, according to the invention.
Figure 4B:
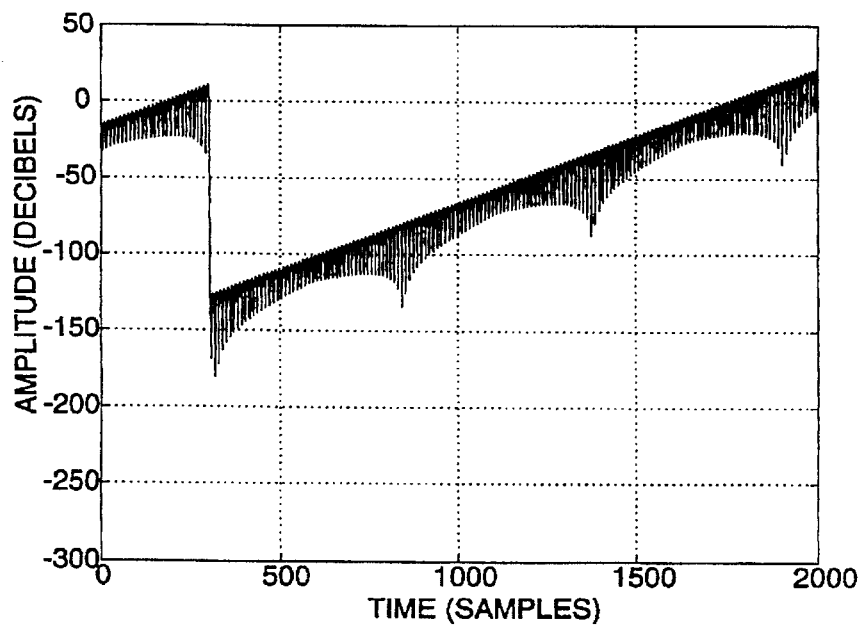

In general, truncated filters like those considered above may not be stable. Consider a filter having rational transfer function $$H(z) = \frac{B'(z) - B''(z)z^{-N}}{A(z)},$$

and output relation $y_0 = b' \cdot x' - b'' \cdot x'' - a \cdot y$. When the roots of A(z) have absolute value greater than 1, quantization errors will be amplified and accumulated noise will eventually dominate the output signal, as shown in FIG. 4. Thus, in this case, a means for stabilizing filter operation is needed.

Figure 5:
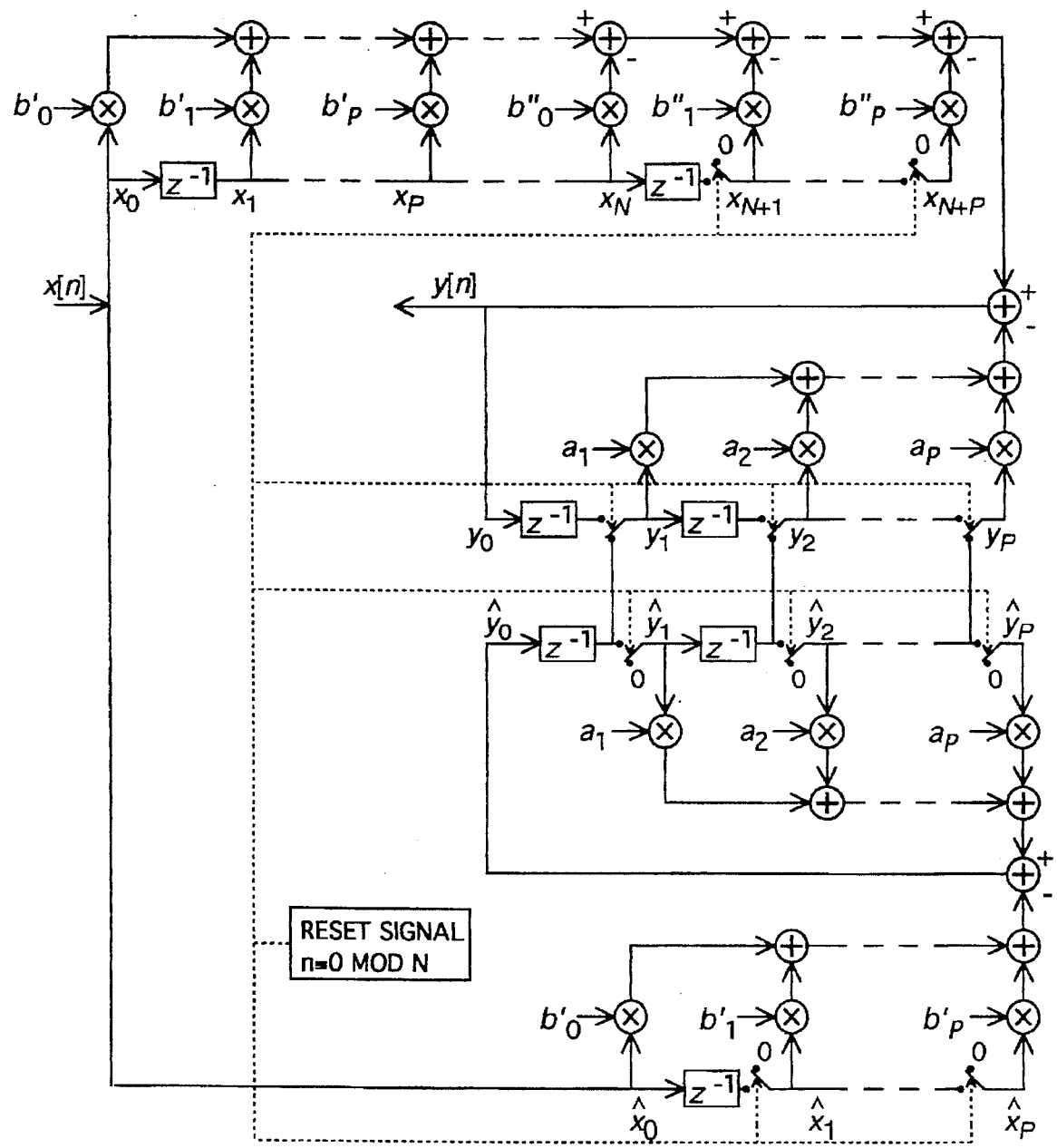
FIG. 5 is a schematic diagram showing the operation of a stabilized TIIR filter during the reset operation, according to the invention.
Figure 6A:
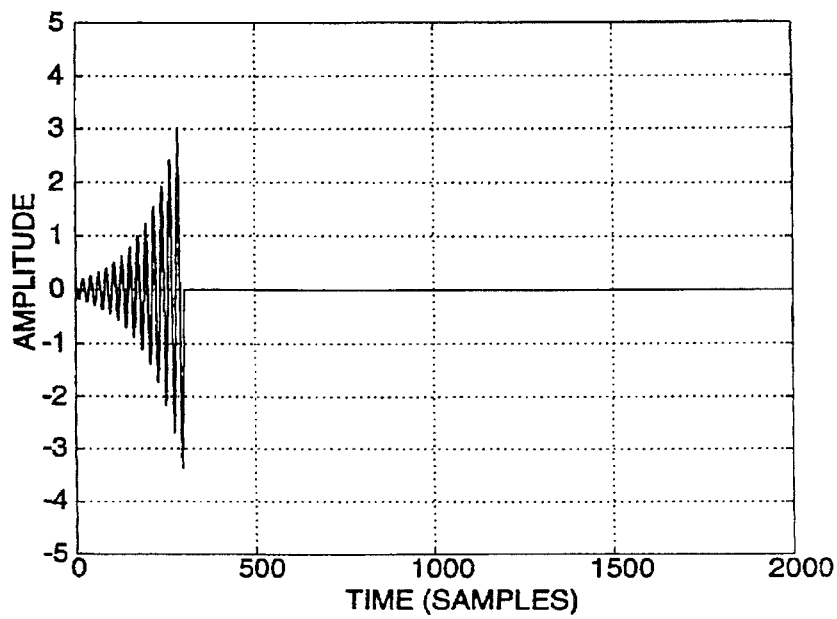
FIG. 6 shows graphs of the output of an unstable TIIR filter after stabilization, according to the invention.
Figure 6B:
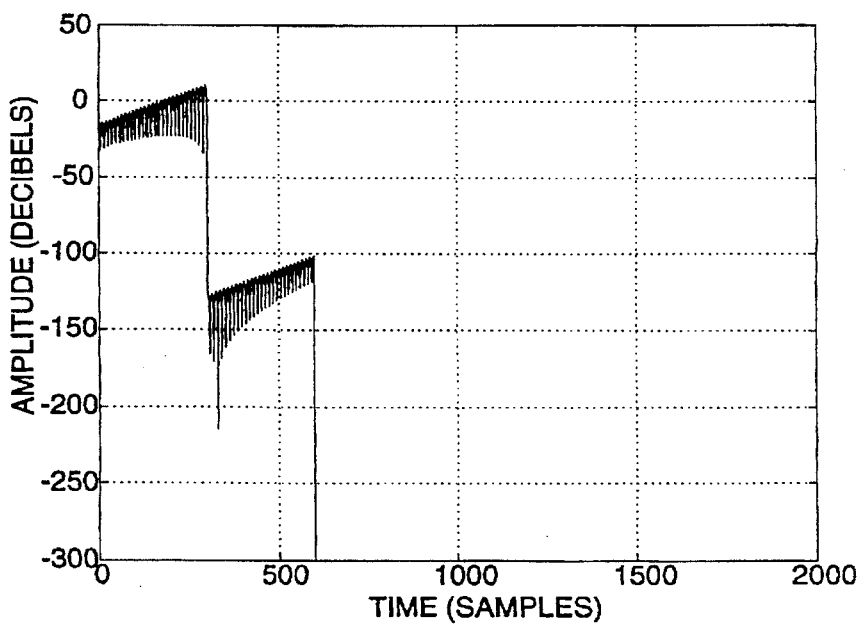
Figure 7A:
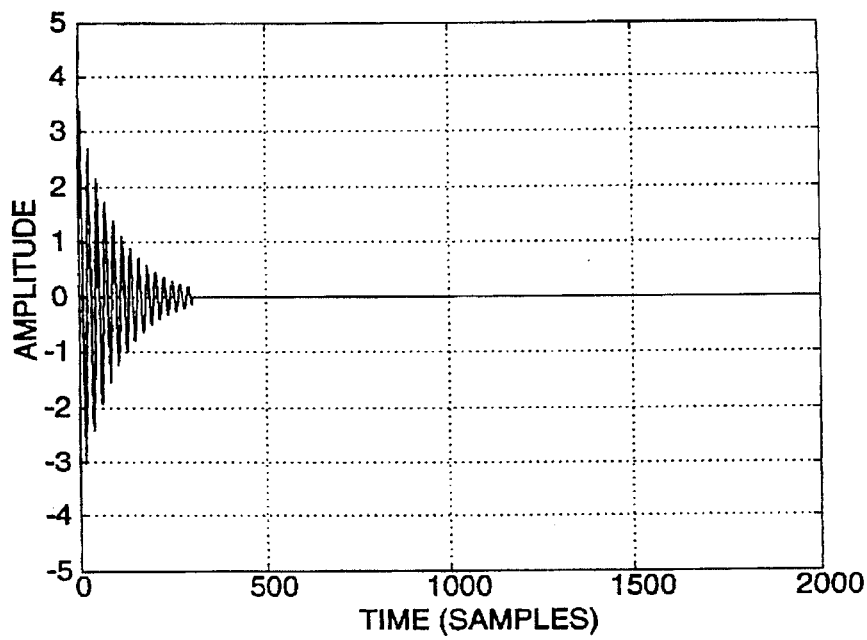
FIG. 7 shows graphs of the output of an stable TIIR filter after stabilization, according to the invention.
Figure 7B:
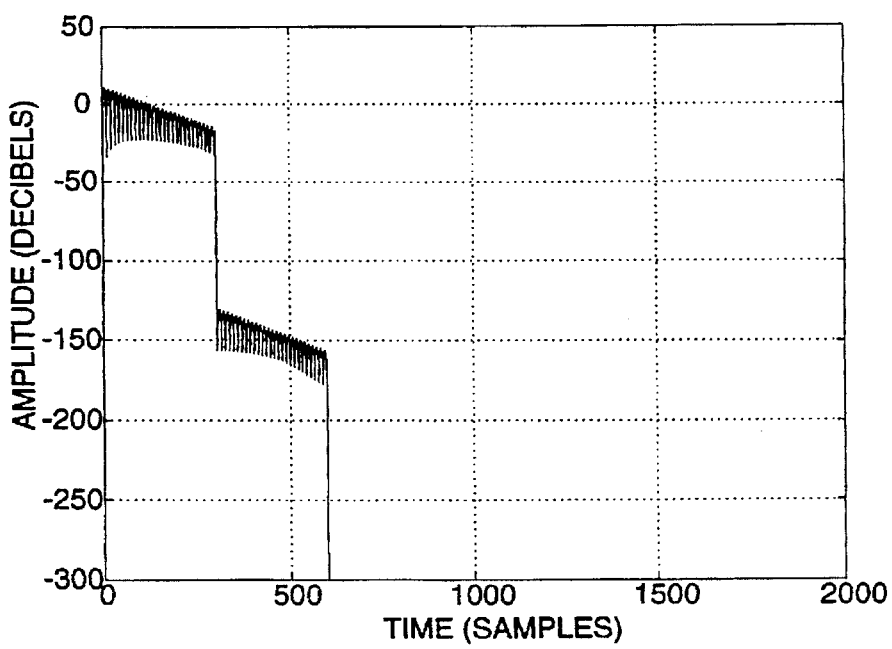

A method is disclosed below for stabilizing such a filter by employing a second auxiliary filter having transfer function $\hat{H}(z) = H(z)$ and output relation $\hat{y}_0 = b' \cdot \hat{x}' - a \cdot \hat{y}$ identical in form to the primary filter, but using input and output delay lines $\hat{x}$ and $\hat{y}$. The two filters are connected as shown in FIG. 5. The auxiliary filter operates in parallel with the primary filter by following steps 1 through 4 exactly as the primary filter for N−1 sampling periods. At period N, however, prior to following steps 1 through 4, a reset signal causes the output delay line of the auxiliary filter to be copied to the output delay line of the primary filter, i.e. $y = \hat{y}$. In addition, both input and output delay lines of the auxiliary filter are cleared, i.e. $\hat{x} = 0$ and $\hat{y} = 0$, and the tail of the input delay line of the primary filter is cleared, i.e. $x'' = 0$. The two filters then proceed to follow steps 1 through 4 as usual. Both filters continue to operate in parallel for another N−1 sampling periods until there is another reset signal. The ultimate effect is to periodically eliminate the accumulated noise in the primary filter while maintaining an uninterrupted filter output, as shown in FIG. 6. Note that this stabilization method can also be applied to a stable filter. For example, if the stable filter whose output is shown in FIG. 2 is stabilized by the above method, then the resulting output will be that shown in FIG. 7.

Because the auxiliary filter delay lines are periodically cleared, its operation may be optimized in several ways. For example, since the input delay line $\hat{x} = (\hat{x}_0, \hat{x}_1, \ldots, \hat{x}_{N+P})$ is cleared every N sampling periods, the last P values of the input delay line will always be zero. Consequently, the $b'' \cdot \hat{x}''$ contribution of the output relation will always be zero and need not be calculated. It follows also that only the first P values of the input delay line, corresponding to $\hat{x}'$, need to be accounted for in the filter operation. (An exception occurs when H(z) is the time-reversed version of a filter with a direct term, in which case $b''_0 \neq 0$.) The calculation of the $b' \cdot \hat{x}'$ and $a \cdot \hat{y}$ terms of the output relation may also be simplified by taking into account the changing number of non-zero components of $\hat{x}'$ and $\hat{y}$. Moreover, the non-zero terms of $b' \cdot x'$ and $b' \cdot \hat{x}'$ are identical and need not be computed twice. Thus, this stabilized filter may be realized as an efficient set of instructions.

DETAILED DESCRIPTION—LINEAR-PHASE FILTER

Figure 8A:
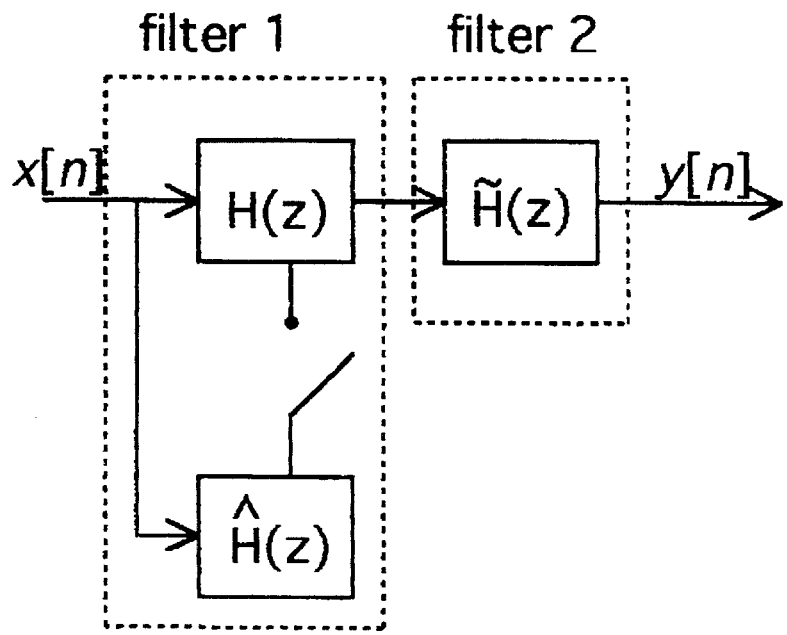
FIG. 8 shows block diagrams of two ways of obtaining a linear-phase filter by combining two filters, according to the invention.
Figure 8B:
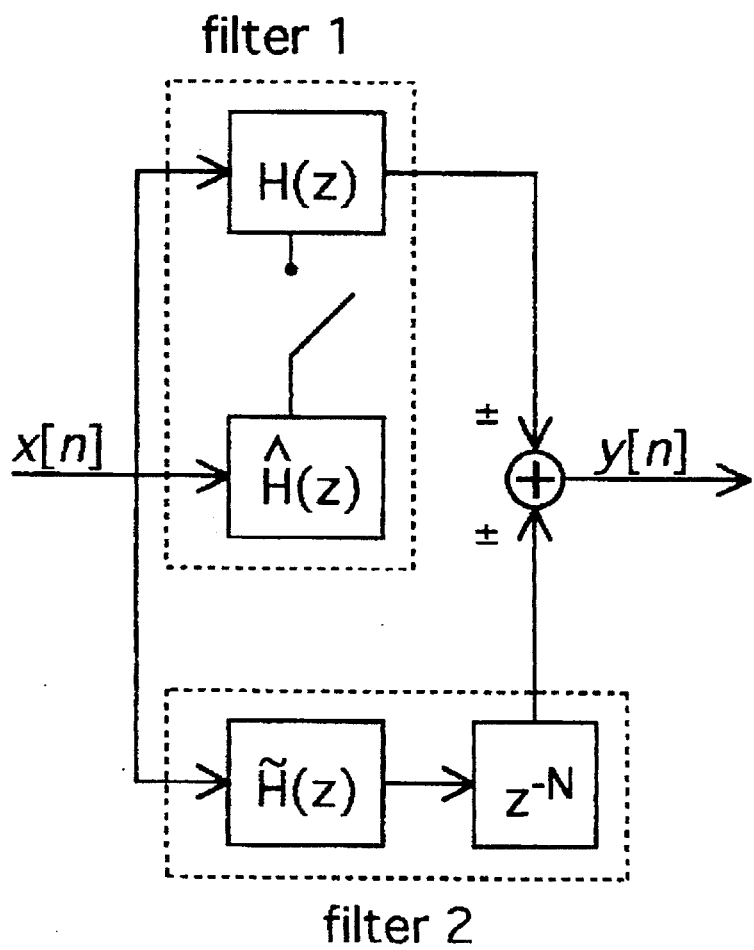

A linear-phase FIR filter may be efficiently constructed and implemented by combining two TIIR filters. As shown in FIG. 8, the two filters may be combined either by cascading them or by adding them. When the filters are added, one filter may be shifted relative to the other by a constant number of steps, steps, N. To insure that the resulting filter combination has a linear phase response, the two filters can be constructed as follows.

Just as in the construction of a TIIR filter, we first select an IIR transfer function, $$H'(z) = \frac{B'(z)}{A(z)}$$

and find the TIIR filter transfer function $$H(z) = \frac{B'(z) - B''(z)z^{-N}}{A(z)}.$$

The transfer function of the second filter, $\tilde{H}(z)$, is the time-reversed transfer function of the first filter, $H(z)$. More specifically, $$\tilde{H}(z) = H(z^{-1})z^{-N} = \frac{-\tilde{B}''(z) + \tilde{B}'(z)z^{-N}}{\tilde{A}(z)},$$

where $\tilde{A}(z)$ is the polynomial obtained from $A(z)=1+a_1z^{-1}+ \ldots +a_P z^{-P}$ by reversing the order of the coefficients, i.e. $\tilde{A}(z)=a_P+a_{P-1}z^{-1}+ \ldots +z^{-P}$, and where $\tilde{B}''(z)$ and $\tilde{B}'(z)$ are similarly obtained from $B''(z)$ and $B'(z)$, respectively. Thus $\tilde{H}(z)$ can be easily and efficiently obtained from $H(z)$. In computer implementation, determining the time-reversed filter response vectors $\tilde{a}$, $\tilde{b}'$, and $\tilde{b}''$ for this time-reversed filter is simply a matter of reversing the order of the components of the filter response vectors for the primary filter.

If $H(z)$ corresponds to a stable filter, then $\tilde{H}(z)$ will correspond to an unstable filter, and vice versa. The unstable filter can be stabilized by the method described above for stabilizing unstable TIIR filters. FIG. 8 shows the case where $H(z)$ is unstable and $\tilde{H}(z)$ is stable. In the case where the filter combination is formed by cascading, either order will result in a linear phase combination, i.e. $H(z)\tilde{H}(z)$ or $\tilde{H}(z)H(z)$. In the case where the filter combination is formed by adding, signs and shifts may be introduced to yield a combination filter of the form $\pm\tilde{H}(z)\pm H(z)z^{-N}$ or $\pm \tilde{H}(z)z^{-N}\pm H(z)$.

An alternative method for implementing a linear-phase filter is also available. If we construct a TIIR filter with transfer function $$H(z) = \frac{B'(z) - B''(z)z^{-N}}{A(z)}$$

such that the roots of $A(z)$ lie on the unit circle, then the resulting filter will necessarily have linear phase.

Figure 9A:
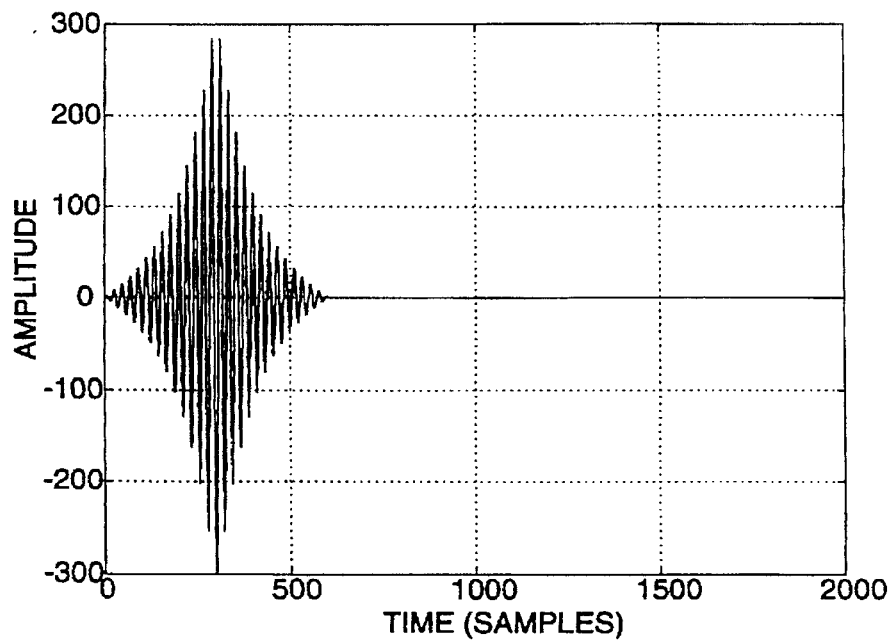
FIG. 9 shows graphs of the output of a linear-phase FIR filter, according to the invention.
Figure 9B:
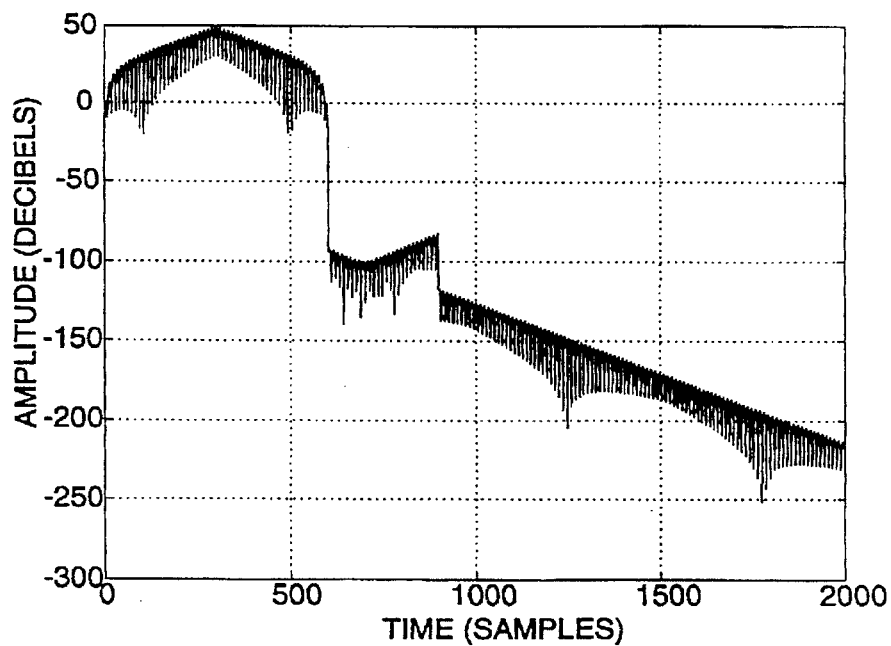

FIG. 9 shows the output from a linear-phase filter constructed and operated as described above.

The above methods of linear-phase filter construction involve simple extensions of the disclosed method for constructing TIIR filters and can be efficiently implemented either by a microprocessor or custom integrated circuit to yield fast linear-phase FIR filters whose responses may be adjusted in real time.

DETAILED DESCRIPTION—TIME-VARYING FIR FILTERS

Figure 10:
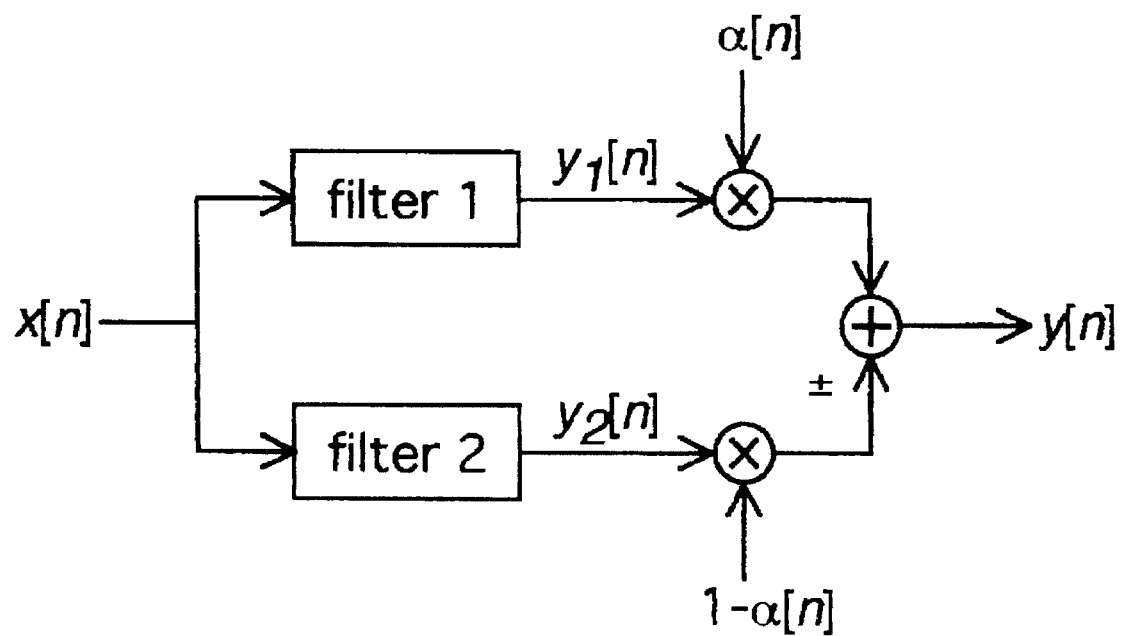
FIG. 10 is a block diagram showing how the signals from two filters may be cross-faded, according to the invention.

To effect a smooth dynamical change of filtering characteristics in real time, a cross-fader may be employed between two filters, as shown in FIG. 10. The two filters, e.g., two FIR filters operated and constructed as described above, are implemented with different filtering responses but are fed the same input signal x[n]. The output signal $y_1[n]$ from one filter is multiplied by a factor of $\alpha[n]$, while the output signal $y_2[n]$ from the other filter is multiplied by a factor of $1-\alpha[n]$, where $\alpha[n]$ is a time-dependent mixing parameter that takes values between 0 and 1. The two attenuated signals are then added together, resulting in a net signal $y[n]=\alpha[n]y_1[n]+(1-\alpha[n])y_2[n]$ that fades gradually between the output of one filter to the output of the other filter as $\alpha[n]$ changes between 0 and 1. Once the output has been faded from one filter to another, new filter characteristics may then be used to construct a new filter in real time and the above cross-fading may be repeated. Thus, the computational efficiency of this method of filter construction allows a signal to be filtered according to characteristics that change in real time.

DETAILED DESCRIPTION—POLYNOMIAL TIMES-EXPONENTIAL RESPONSES

An important application of the invention is to provide polynomial-times-exponential response filters, and, in particular, to provide a fast Kay smoothing filter for frequency estimation. (Here 'exponential' includes the case of complex modes as well as real modes, thus encompassing sinusoidal responses.) Because of their long tails, exponential responses are often undesirable in many signal processing applications, such as in averaging highly non-stationary data. Polynomial-times-exponential response filters provide an efficient method for implementing the appropriate filters. Polynomial-times-exponential responses are generated by defining $A(z)$ to have repeated roots. If $\rho$ is a root of multiplicity M, then the impulse response will contain additive terms of the form $Q[n]\rho^n$, where $Q[n]$ is an $(M-1)^{th}$ degree polynomial in n.

The Kay window is a particularly useful polynomial-times-exponential impulse response used for statistically efficient frequency estimation based on smoothed phase differences. The weighting coefficients for the Kay window are given by $$w[n] = \frac{6N}{N^2-1}\left\{\frac{n}{N} - \left(\frac{n}{N}\right)^2\right\},$$

for $1 \leq n \leq N-1$. This yields a filter transfer function given by the formula $$H(z) = \frac{6}{N(N^2-1)} \frac{(N-1)z^{-1} - (N+1)z^{-2} + (N+1)z^{-N-1} - (N-1)z^{-N-2}}{(1-z^{-1})^3}$$

which may be implemented according to the disclosed method of filter construction and operation. In this case the exponential mode is unity so that the resulting response is a pure polynomial. Details regarding the application of this window to frequency estimation are included in the paper of S. Kay ("Statistically/computationally efficient frequency estimation", in *Proc. ICASSP*, pp. 2292–2295, IEEE Service center, 1988), which is hereby incorporated by reference.

Other types of windows may be similarly implemented. For example, the Bartlett window may be generated with the transfer function $$H(z) = \frac{1}{N} \frac{1 - z^{-N} - z^{-(N+1)} + z^{-(2N+1)}}{1 - 2z^{-1} + z^{-2}}.$$

The Hanning and Hamming windows, with respective transfer functions $$H(z) = $$

$$1/2 \left( \frac{1-z^{-N}}{1-z^{-1}} - \frac{1 - \cos\left(\frac{2\pi}{N-1}\right)(z^{-1} + z^{-N}) + z^{-N-1}}{1 - 2\cos\left(\frac{2\pi}{N-1}\right)z^{-1} + z^{-2}} \right),$$

and $$H(z) = 0.54 \frac{1 - z^{-N}}{1 - z^{-1}} -$$

$$0.46 \frac{1 - \cos\left(\frac{2\pi}{N-1}\right)(z^{-1} + z^{-N}) + z^{-N-1}}{1 - 2\cos\left(\frac{2\pi}{N-1}\right)z^{-1} + z^{-2}},$$

are also useful.

All of the above embodiments and applications may be implemented as instruction steps encoded on a general-purpose microprocessor or as a dedicated integrated circuit as is customarily done in the mass production of high-speed computational devices.

Ramifications and Scope

While the above descriptions contain many specificities, these should not be construed as limitations on the scope of the invention, but rather as an illustration of particular embodiments thereof. Many other variations are possible. For example, many types of windows may be used in the same manner as described for the Kay, Bartlett, Hanning and Hamming windows. Additionally, the transfer function for a filter may be decomposed in the form of a partial fraction expansion and each term may be separately implemented as an independent filter. In particular, in the case of a linear-phase filter, each unstable mode may be stabilized separately and truncated at different cut-off points in order to minimize dynamic range constraints.

Any of the filters may be implemented as custom-designed integrated circuits or as instructions to be executed by a microprocessor. More generally, the disclosed method of filter operation may be performed by any computational means. The disclosed method of filter construction, however, may be followed by a design engineer, after which the resulting filter response vectors may be preset in a manufactured filter. Alternatively, the construction method may be followed by any computational means, thus enabling real-time variation of filtering characteristics while the filter is in operation.

Accordingly, the scope of the invention should be determined not by the specific embodiments illustrated, but by the appended claims and their legal equivalents.

I claim:

1. A method of digital signal processing using a computational means for filtering an input signal to obtain an output signal in accordance with a desired filter response, the method comprising the steps of:

selecting a first filter response vector and a second filter response vector, determining a third filter response vector from the first filter response vector and the second filter response vector by an algorithm including the synthetic division algorithm, and generating the output signal from the input signal, the first filter response vector, the second filter response vector, and the third filter response vector by executing on the computational means a set of filter operation instructions.

2. The method of claim 1 wherein the determining step is performed by executing on the computational means a set of filter construction instructions, and the synthetic division algorithm calculates the remainder $B''(z) = b''_0 + b''_1 z^{-1} + \ldots + b''_P z^{-P}$ of the division of a polynomial $B'(z)(z^N = (b'_0 + b'_1 z^{-1} + \ldots + b'_P z^{-P})z^N$ by a polynomial $A(z) = 1 + a_1 z^{-1} + \ldots + a_P z^{-P}$, where the first filter response vector has the form $b' = (b'_0, \ldots, b'_P)$, the second filter response vector has the form $a = (a_1, \ldots, a_P)$, and the third filter response vector has the form $b'' = (b''_0, \ldots, b''_P)$.

3. The method of claim 1 wherein the set of filter operation instructions comprises:

shifting an input delay line, shifting an output delay line, storing a new signal input value in the input delay line, generating a new signal output value using an output relation of the form $y[n] = b' \cdot x' - b'' \cdot x'' - a \cdot y$, and storing the new signal output value in the output delay line.

4. The method of claim 3 wherein the set of filter operation instructions further comprises shifting an auxiliary input delay line, shifting an auxiliary output delay line, storing the new signal input value in the auxiliary input delay line, generating an auxiliary filter output value using an auxiliary output relation of the form $y[n] = b' \cdot x' - a \cdot y$, storing the auxiliary filter output value in the auxiliary filter output delay line, copying periodically the auxiliary output delay line to the output delay line, clearing periodically the auxiliary input delay line, clearing periodically a tail end of the input delay line, and clearing periodically the auxiliary output delay line.

5. The method of claim 4 wherein the set of filter operation instructions further comprises shifting a time-reversed filter input delay line, shifting a time-reversed filter output delay line, storing the new signal output value in the time-reversed filter input delay line, generating a time-reversed filter output value using an output relation $\tilde{y}[n] = -\tilde{b}'' \cdot \tilde{x}' + \tilde{b}' \cdot \tilde{x}'' - \tilde{a} \cdot \tilde{y}$, where $\tilde{b}''$, $\tilde{b}'$, and $\tilde{a}$ are reversed filter response vectors, and storing the time-reversed filter output value in the time-reversed filter output delay line.

6. The method of claim 1 wherein the selecting step comprises selecting the desired filter response to be determined by a polynomial-times-exponential response chosen from the group consisting of a Kay window, a Bartlett window, a Hanning window, and a Hamming window.

7. A method of digital signal processing for filtering an input signal, represented by an input signal sequence, $x[0]$, $x[1], x[2], \ldots, x[n]$, to obtain an output signal, represented by an output signal sequence, $y[0], y[1], y[2], \ldots, y[n]$, the method employing a computational means and comprising the steps of:

choosing two filter response vectors, $b'=(b'_0, \ldots, b'_P)$ and $a=(a_1, \ldots, a_P)$, which specify a desired filter response, calculating a third filter response vector, $b''=(b''_0, \ldots, b''_P)$, determined by a polynomial remainder $B''(z) = b''_0 + b''_1 z^{-1} + \ldots + b''_P z^{-P}$ resulting from the division of a polynomial $B'(z)z^N = (b'_0 + b'_1 z^{-1} + \ldots + b'_P z^{-P})z^N$ by a polynomial $A(z) = 1 + a_1 z^{-1} + \ldots + a_P z^{-P}$, encoding in the computational means a set of filter operation instructions to calculate the output signal sequence, $y[0], y[1], y[2], \ldots, y[n]$, from the input signal sequence, $x[0], x[1], x[2], \ldots, x[n]$, the operation instructions comprising a calculation of an output relation, $y[n] = b' \cdot x' - b'' \cdot x'' - a \cdot y$, and generating with the computational means the output signal from the input signal by computing the output signal sequence from the input signal sequence in accordance with the filter operation instructions, whereby the input signal is efficiently filtered to produce the output signal in a manner determined by the desired filter response.

8. The method of claim 7 further comprising encoding in the computational means a set of filter construction instructions for calculating the third filter response vector, $b''=(b''_0, \ldots, b''_P)$, and wherein the calculating step is performed by the computational means following the filter construction instructions.

9. The method of claim 7 wherein the operating instructions further comprise calculating an output relation, $\hat{y}[n] = b' \cdot \hat{x}' - b'' \cdot \hat{x}'' - a \cdot \hat{y}$, for an auxiliary filter, copying periodically an output delay line of the auxiliary filter to an output delay line of a primary filter, clearing periodically a tail end of an input delay line of the primary filter, clearing periodically an input delay line of the auxiliary filter, and clearing periodically the output delay line of the auxiliary filter, whereby accumulated noise in the output signal will be eliminated periodically.

10. The method of claim 7 wherein the choosing step comprises selecting the desired filter response to be determined by a polynomial-times-exponential response selected from the group consisting of a Kay window, a Bartlett window, a Hanning window, and a Hamming window.

11. A method of digital signal processing for filtering an input signal, represented by an input signal sequence, $x[0], x[1], x[2], \ldots, x[n]$, to obtain an output signal, represented by an output signal sequence, $y[0], y[1], y[2], \ldots, y[n]$, the method employing a computational means and comprising the steps of:

choosing two filter response vectors, $b'=(b'_0, \ldots, b'_P)$ and $a=(a_1, \ldots, a_P)$, which specify a desired filter response, calculating a third filter response vector, $b''=(b''_0, \ldots, b''_P)$, determined by a polynomial remainder $B''(z) = b''_0 + b''_1 z^{-1} + \ldots + b''_P z^{-P}$ resulting from the division of a polynomial $B'(z)z^N = (b'_0 + b'_1 z^{-1} + \ldots + b'_P z^{-P})z^N$ by a polynomial $A(z) = 1 + a_1 z^{-1} + \ldots + a_P z^{-P}$, encoding in the computational means a set of filter operation instructions to calculate the output signal sequence, $y[0], y[1], y[2], \ldots, y[n]$, from the input signal sequence, $x[0], x[1], x[2], \ldots, x[n]$, the operation instructions comprising:

calculating an output relation, $y_1[n] = b' \cdot x' - b'' \cdot x'' - a \cdot y_1$, for a primary filter, calculating an output relation, $\hat{y}[n] = b' \cdot \hat{x}' - b'' \cdot \hat{x}'' - a \cdot \hat{y}$, for an auxiliary filter, calculating an output relation, $\tilde{y}[n] = \tilde{b}' \cdot \tilde{x}' - \tilde{b}'' \cdot \tilde{x}'' - \tilde{a} \cdot \tilde{y}$, for a time-reversed filter defined by a time-reversed transfer function, $\tilde{H}(z)$, combining the calculated output relations for the primary filter, the auxiliary filter and the time-reversed filter to obtain the output signal sequence $y[0], y[1], y[2], \ldots, y[n]$, copying periodically an output delay line of the auxiliary filter to an output delay line of the primary filter, clearing periodically a tail end of an input delay line of the primary filter, clearing periodically an input delay line of the auxiliary filter, and clearing periodically the output delay line of the auxiliary filter, and generating with the computational means the output signal from the input signal by computing the output signal sequence from the input signal sequence in accordance with the filter operation instructions, whereby the desired filter response has a linear-phase response.

12. A method of digital signal processing for filtering an input signal, represented by an input signal sequence, $x[0], x[1], x[2], \ldots, x[n]$, to obtain an output signal, represented by an output signal sequence, $y[0], y[1], y[2], \ldots, y[n]$, the method employing a computational means and comprising the steps of:

choosing two filter response vectors, $b'=(b'_0, \ldots, b'_P)$ and $a=(a_1, \ldots, a_P)$, which specify a desired filter response, calculating a third filter response vector, $b''=(b''_0, \ldots, b''_P)$, determined by a polynomial remainder $B''(z) = b''_0 + b''_1 z^{-1} + \ldots + b''_P z^{-P}$ resulting from the division of a polynomial $B'(z)z^N = (b'_0 + b'_1 z^{-1} + \ldots + b'_P z^{-P})z^N$ by a polynomial $A(z) = 1 + a_1 z^{-1} + \ldots + a_P z^{-P}$, encoding in the computational means a set of filter operation instructions to calculate the output signal sequence, $y[0], y[1], y[2], \ldots, y[n]$, from the input signal sequence, $x[0], x[1], x[2], \ldots, x[n]$, the operation instructions comprising:

calculating an output relation, $y[n] = b' \cdot x' - b'' \cdot x'' - a \cdot y$, for a primary filter, attenuating the output signal $y[n]$ by a factor of $\alpha[n]$ to obtain an attenuated output signal, where the factor of $\alpha[n]$ ranges between 0 and 1, shifting the attenuated output signal by an integral number of steps, calculating an output relation, $\hat{y}[n] = b' \cdot \hat{x}' - b'' \cdot \hat{x}'' - a \cdot \hat{y}$, for an auxiliary filter, copying periodically an output delay line of the auxiliary filter to an output delay line of the primary filter, clearing periodically a tail end of an input delay line of the primary filter, clearing periodically an input delay line of the auxiliary filter, and clearing periodically the output delay line of the auxiliary filter, and generating with the computational means the output signal from the input signal by computing the output signal sequence from the input signal sequence in accordance with the filter operation instructions, whereby the output signal may be cross-faded with a signal from a second filter.

\* \* \* \* \*